US006751563B2

(12) United States Patent
Spanier et al.

(10) Patent No.: US 6,751,563 B2
(45) Date of Patent: Jun. 15, 2004

(54) ELECTRONIC POWER METER

(75) Inventors: Joseph Spanier, Brooklyn, NY (US); Wei Wang, Bronx, NY (US); Erran Kagan, Port Washington, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 68 days.

(21) Appl. No.: 10/121,262

(22) Filed: Apr. 12, 2002

(65) Prior Publication Data

US 2002/0169570 A1 Nov. 14, 2002

Related U.S. Application Data

(60) Provisional application No. 60/290,511, filed on May 11, 2001.

(51) Int. Cl.[7] .................................................. G06F 3/06
(52) U.S. Cl. .............................. 702/61; 702/57; 702/60; 702/64
(58) Field of Search .............................. 702/38, 61, 64, 702/65, 68, 186, 198, 57, 60, 188, 189; 395/750; 709/221; 705/35

(56) References Cited

U.S. PATENT DOCUMENTS

| 5,862,391 A | * | 1/1999 | Salas et al. ............. 395/750.01 |
| 2002/0120723 A1 | * | 8/2002 | Forth et al. .................. 709/221 |
| 2002/0162014 A1 | * | 10/2002 | Przydatek et al. .......... 713/200 |
| 2003/0009401 A1 | * | 1/2003 | Ellis ............................ 705/35 |

* cited by examiner

Primary Examiner—Marc S. Hoff
Assistant Examiner—Felix Suarez
(74) Attorney, Agent, or Firm—Dilworth & Barrese, LLP

(57) ABSTRACT

An electric power meter having a digital sampler for sampling a voltage and a current at a sampling point and having a processor for processing at least one of the sampled voltage and the sampled current. A memory is provided for storing network protocol conversion algorithms. The electric utility power meter has a network interface. The processor performs at least one power calculation and converts at least one of the sampled voltage, the sampled current and the power calculation to at least one network protocol using said network protocol conversion algorithms, said at least one network protocol provided through said network interface.

12 Claims, 2 Drawing Sheets

ELECTRONIC POWER METER

PRIORITY

This application claims priority to a provisional application entitled "Web Server Power Quality and Revenue Meter" filed in the United States Patent and Trademark Office on May 11, 2001 and assigned Application No. 60/290,511, the contents of which are hereby incorporated by reference.

BACKGROUND OF THE INVENTION

1. Field of the Invention

The present disclosure relates to socket-type electrical meters, and, more particularly, to a system which provides power quality and revenue metering information to remote locations.

2. Description of the Related Art

Electric utility companies ("utilities") track electric usage by customers by using power meters. These meters track the amount of power consumed at a particular location. These locations range from power substations, to commercial businesses, to residential homes. The electric utility companies use the power meter to charge its customers for their power consumption, i.e. revenue metering.

A popular type of power meter is the socket-type power meter. As its name implies, the meter itself plugs into a socket for easy installation, removal and replacement. Other meter installations include panel mounted, switchboard mounted, and circuit breaker mounted. Typically the power meter connects between utility power lines supplying electricity and a usage point, namely a residence or commercial place of business. Though not typical, a power meter may also be placed at a point within the utility's power grid to monitor power flowing through that point for distribution, power loss, or capacity monitoring. Also, power meters can be used to monitor internal customer usage, that handle submetering functions.

Traditionally, power meters used mechanical means to track the amount of consumed power. The inductive spinning disk power meter is still commonly used. The spinning disk drives mechanical counters that track the power consumption information.

Newer to the market are electronic power meters. Electronic meters have replaced the older mechanical meters, and utilize digital sampling of the voltage and current waveforms to generate power consumption information. In addition to monitoring power consumption, electronic meters can also monitor and calculate power quality, that is, voltage, current, real power, reactive power, and apparent power, among others. These power quality measurements and calculations are displayed on an output display device on the meter.

In more recent developments, limited power consumption information can be transmitted from the power meter to the utility through the use of telephone communications circuitry contained either within or external to the meter. These developments are advantageous to the utility company in that it reduces the need for employees being dispatched to the remote locations to collect the power consumption information. A standard modem receives raw power consumption information from the power meter and transmits the information to the utility company via telephone lines. While this represents an improvement over past techniques, this information then must be interpreted and further processed to calculate the amount of power consumption, a secondary process that results in further processing apparatus and software, and further resulting in increases to the costs and complexities of the overall system.

There is therefore a need for an electronic power meter that can process raw power consumption information. There is a further need for an electronic power meter that can make available processed power consumption information to multiple end users. And a still further need exists for an electronic power meter that provides processed power information to multiple users in a format that is easily viewed and interpreted by an end user.

SUMMARY OF THE INVENTION

It is therefore an object of the present invention to provide an electronic power meter that processes raw power consumption information.

It is another object of the present invention to provide an electronic power meter that makes available processed power consumption information to multiple end users.

It is yet another object of the present invention to provide an electronic power meter that makes available processed power consumption information to multiple end users in a format that is easily viewed and interpreted by an end user.

The present invention is an electric power meter providing real time revenue calculations as well as power quality metering. The power meter actively updates a number of users over the Internet in real time. A user can be utility personnel or customers. The power meter is also capable of communicating through several ports using several different communication protocols simultaneously. The interfaces, including web pages, are user definable and configurable. The meter is installable as a socket type meter, a panel mounted meter, a switchboard mounted meter, or a circuit breaker meter.

In one embodiment of the present application, a web server provides real time data through an Hypertext Markup Language (HTML) or Extensible Markup Language (XML) interface. Additionally, the web server allows viewing of stored historical and power quality data and provides users with an interface for retrieval of historical data via industry standard protocols including Hypertext Transfer Protocol (HTTP) and File Transfer Protocol (FTP).

In another embodiment of the present invention, the web server operates as a Modbus Transmission Control Protocol/Internet Protocol (TCP/IP) Gateway for the power meter and existing serial based devices that connect through a network serial port to allow data be monitored or transferred via a network infrastructure.

In a further embodiment of the present invention, a socket-type electric power meter provides concurrent operation of a web server, Modbus TCP and additional protocols which are supported by the power meter, thus allowing the power meter to be easily incorporated into existing power control systems as well as providing access to real-time web information, such as the revenue calculations, metering data and power quality data, using a standard web browser.

BRIEF DESCRIPTION OF THE DRAWINGS

The advantages and features of the presently disclosed web server power quality and revenue meter will become more readily apparent and may be understood by referring to the following detailed description of illustrative embodiments taken in conjunction with the accompanying drawings, in which.

DETAILED DESCRIPTION OF THE PREFERRED EMBODIMENTS

A preferred embodiment of the present invention will be described in detail herein below with reference to the accompanying drawings. In the following description, numerous specific details are set forth to provide a more thorough understanding of the present invention. It will be apparent, however, to one skilled in the art that the present invention may be practiced without these specific details. In other instances, well known functions or constructions have not been described so as not to obscure the present invention.

Figure 1:
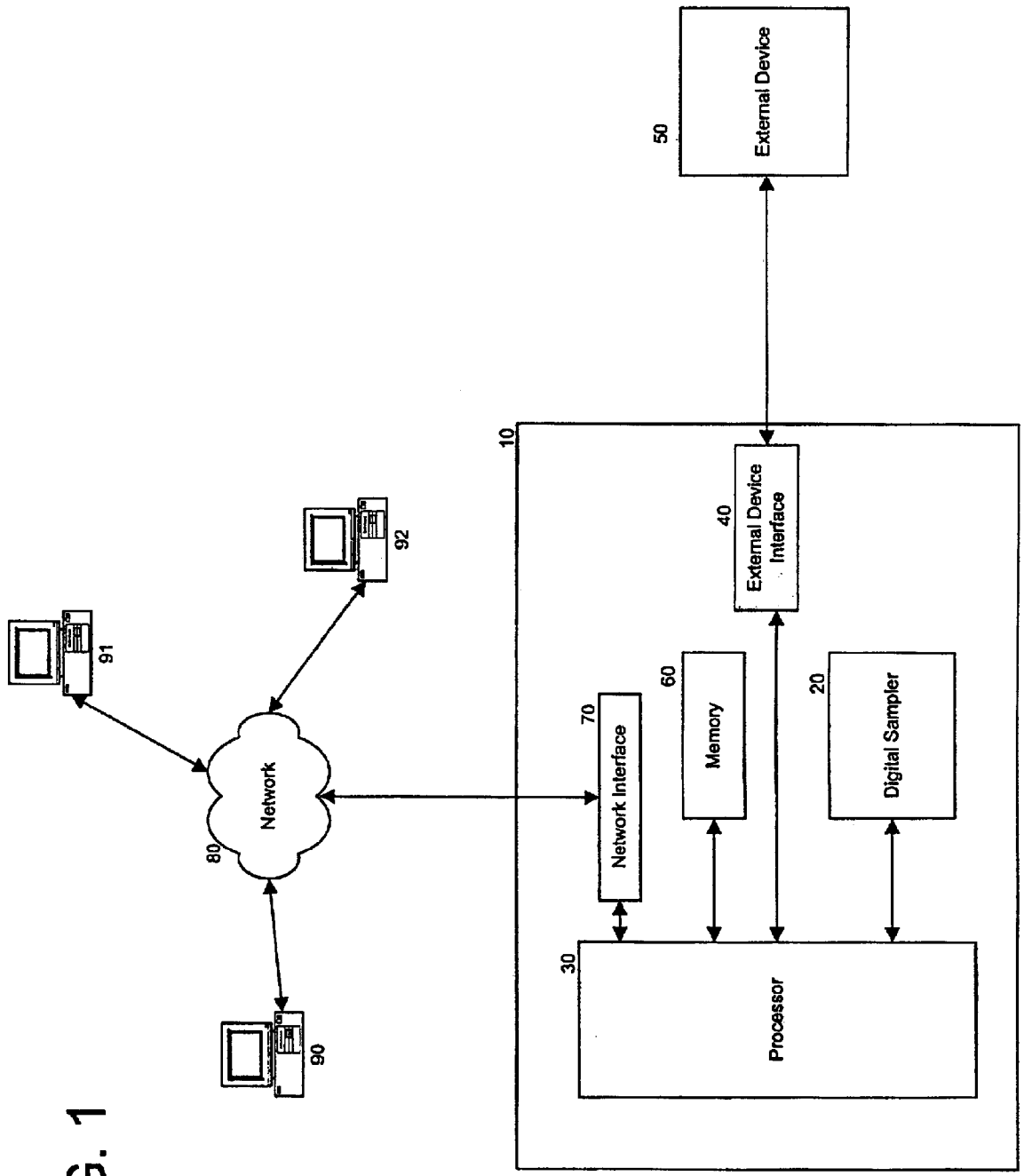
FIG. 1 is a block diagram of a power quality and revenue meter according to an embodiment of the present invention.

FIG. 1 is a block diagram of a web server power quality and revenue meter according to an embodiment of the present invention. Shown in FIG. 1 are power quality and revenue meter (meter) 10. The meter is connected to monitor electric distribution power lines (not shown), to monitor voltage and current at the point of connection. Included therein is digital sampler 20 for digitally sampling the voltage and current of the power being supplied to a customer or monitored at the point of the series connection in the power grid. Digital sampler 20 digitally samples the voltage and current. The digital samples are then forwarded to processor 30 for processing. Also connected to processor 30 is external device interface 40 for providing an interface for external devices 50 to connect to meter 10. These external devices might include other power meters, substation control circuitry, on/off switches, etc. Processor 30 receives data packets from digital sampler 20 and external devices 50, and processes the data packets according to user defined or predefined requirements. A memory 60 is connected to processor 30 for storing data packets and program algorithms, and to assist in processing functions of processor 30. These processing functions include the power quality data and revenue calculations, as well as formatting data into different protocols which will be described later in detail. Processor 30 provides processed data to network 80 through network interface 70. Network 80 can be the Internet, the World Wide Web (WWW), an intranet, a wide area network (WAN), or local area network (LAN), among others. In the preferred embodiment, the network interface converts the data to an Ethernet TCP/IP format. The use of the Ethernet TCP/IP format allows multiple users to access the power meter simultaneously. In a like fashion, network interface 70 might be comprised of a modem, cable connection, or other devices that provide formatting functions. Computers 90–92 are shown connected to network 80.

A web server program (web server) is contained in memory 60, and accessed through network interface 70. The web server provides real time data through any known web server interface format. For example, popular web server interface formats consist of HTML and XML formats. The actual format of the programming language used is not essential to the present invention, in that any web server format can be incorporated herein. The web server provides a user friendly interface for the user to interact with the meter 10. The user can have various access levels to enter limits for e-mail alarms. Additionally, the user can be provided the data in a multiple of formats including raw data, bar graph, charts, etc. The currently used HTML or XML programming languages provide for easy programming and user friendly user interfaces.

The operation of the device of FIG. 1 will now be described. Digital sampler 20 samples the voltage and current at and flowing through the point of connection, or sampling point. The voltage and current readings, in the form of data packets, are forwarded to processor 30 where they undergo various power calculations. Processor 30 calculates, for example, instantaneous voltage and current, real power, reactive power, and apparent power. The processing algorithms can be preprogrammed into memory 60, uploaded by an end user, or performed at the end-user's location. The calculations performed by processor 30 are not meant to be all inclusive, as the processor can be programmed to provide any number of preprogrammed or user defined calculations. In addition to performing the calculations, processor 30 sends the packet data to memory 60 to be stored for future access. As digital sampler 20 is sampling the voltage and current at the sampling point, external device 50 can be feeding parallel information to processor 30 through external device interface 40. This external device packet data would be processed and stored in a similar manner as the digital sampler packet data. Processor 30 then formats the processed data into various network protocols and formats. The protocols and formats can, for example, consist of the web server HTML or XML formats, Modbus TCP, RS-485, FTP or e-mail. Dynamic Host Configuration Protocol (DHCP) can also be used to assign IP addresses. The network formatted data is now available to users at computers 90–92 through network 80, that connects to meter 10 at the network interface 70.

In the preferred embodiment of the present invention, network interface 70 is an Ethernet interface that supports, for example, 100 base-T or 10 base-T communications. This type of network interface can send and receive data packets between WAN connections and/or LAN connections and the meter 10. This type of network interface allows for situations, for example, where the web server may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer and maintenance personnel to simultaneously and interactively monitor and diagnose possible problems with the power service.

Figure 2:
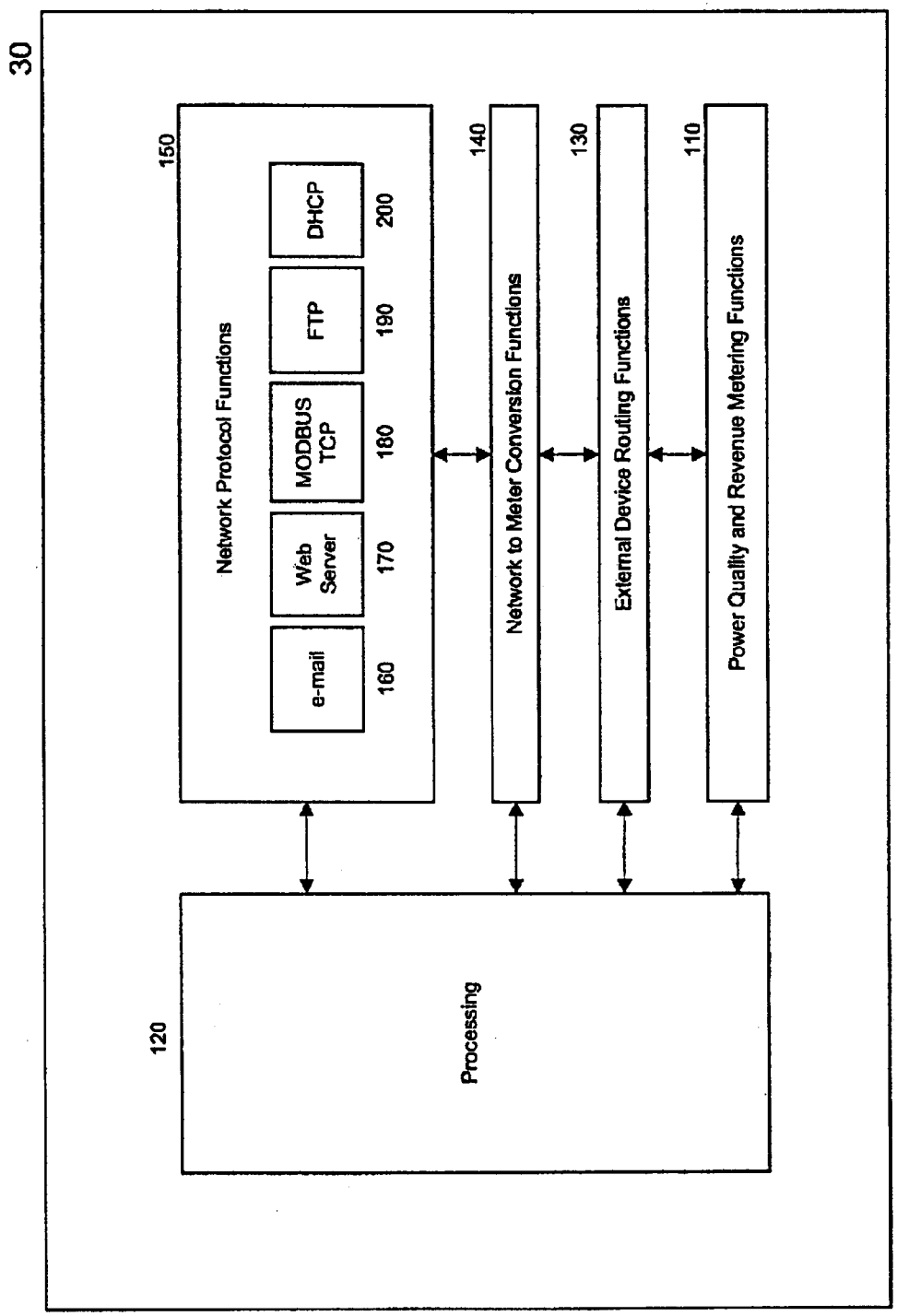
FIG. 2 is a functional block diagram of the processor functions of a power quality and revenue meter system shown in FIG. 1 according to the embodiment of the present invention.

FIG. 2 is a functional block diagram of processor 30 of the web server power quality and revenue meter system according to the embodiment of the present invention. FIG. 2 illustrates the functional processing structure of processor 30. Processor 30 is shown containing four main processing functions. Processing 120 can be realized in various memory configurations, and are not limited to any one configuration. The functions shown are illustrative and not meant to be inclusive of all possible functions performed by processor 30. Power Quality and Revenue Metering functions (metering functions) 110 consists of a complete set of functions which are needed for power quality and revenue metering. Packet data collected by digital sampler 20 is transmitted to processor 30. Processor 30 calculates, for example, power reactive power, apparent power, and power factor. The metering function 110 responds to commands via the network or other interfaces supported by the meter. External Device Routing Functions 130 handle the interfacing between the external device 50 and meter 10. Raw data from external device 50 is fed into meter 10. The external device 50 is assigned a particular address. If more than one external device is connected to meter 10, each device will be assigned a unique particular address.

Referring again to FIG. 1, network interface 70 can support, for example, either 100 base-T or 10 base-T communications, and receives and sends data packet between a wide area network (WAN) connection and/or local area network (LAN) connection and the meter. The Network Protocol Functions of meter 10 are executed by processor 30 which executes multiple networking tasks that are running concurrently. As shown in FIG. 2, these include, but are not limited to, the following network tasks included in network protocol functions 150: e-mail 160, web server 170, Modbus TCP 180, FTP 190, and DHCP 200. The e-mail 160 network protocol function can be utilized to send e-mail messages via the network 80 to a user to, for example, notify the user of an emergency situation or if the power consumption reaches a user-set or pre-set high level threshold.

As the processor receives packets of data it identifies the network processing necessary for the packet by the port number associated with the packet. The processor allocates the packet to a task as a function of the port number. Since each task is running independently the meter 10 can accept different types of requests concurrently and process them transparently from each other. For example, the web server may be accessed by one user while another user is communicating via Modbus TCP and at the same time a third user may download a log file via FTP.

The Network to Meter Protocol Conversion Function 140 is used to format and protocol convert the different network protocol messages to a common format understood by the other functional sections of meter 10. After the basic network processing of the packet of data, any "commands" or data which are to be passed to other functional sections of meter 10 are formatted and protocol converted to a common format for processing by the Network to Meter Protocol Conversion Function 140. Similarly, commands or data coming from the meter for transfer over the network are pre-processed by this function into the proper format before being sent to the appropriate network task for transmission over the network. In addition this function first protocol converts and then routes data and commands between the meter and external devices.

While the invention has been particularly shown and described with reference to a preferred embodiment, it will be understood by those skilled in the art that various modifications in form and detail may be made therein without departing from the scope or spirit of the invention. Accordingly, modifications, such as those suggested above, but not limited thereto are to be considered within the scope of the presently disclosed web server power quality and revenue meter.

What is claimed is:

1. An electric power meter having a digital sampler for sampling a voltage and a current at a sampling point comprising:
  a processor coupled to said digital sampler and configured to execute a plurality of different tasks related to said sampled voltage and current and running independently from one another in response to a plurality of concurrent requests submitted by multiple users;
  a memory coupled to said processor for storing network protocol conversion algorithms; and
  a network interface configured to simultaneously provide said multiple users each with a result of a respective one of said plurality of different tasks;
  wherein said processor performs at least one power calculation and converts at least one of the sampled voltage, the sampled current and the power calculation to at least one network protocol using one of said network protocol conversion algorithms, said at least one network protocol being provided through said network interface.

2. The electric power meter of claim 1, wherein said plurality of different tasks include executing real time data, e-mailing, displaying historical and power quality data stored in the memory, and accessing said historical and power quality data via industry standard protocols.

3. The electric power meter of claim 2, wherein said network interface is an Ethernet interface.

4. The electric power meter of claim 1, wherein said network protocol is one of Modbus Transmission Control Protocol (TCP), RS-485, e-mail, File Transfer Protocol (FTP), or Dynamic Host Configuration Protocol (DHCP).

5. The electric power meter of claim 1, wherein a web server provides data to the network interface in Hypertext Markup Language (HTML) or Extensible Markup Language (XML) format.

6. The electric power meter of claim 2, further comprising an external device interface for connecting on at least one external device to said electric power meter, wherein said at least one external device transmits packet data related to said power quality data to said electric power meter to be processed and provided to said multiple users through said network interface, said processor being operative to e-mail alarms in response to meeting predefined conditions.

7. An electric power meter, comprising:
  a digital sampler for digitally sampling voltage and current;
  a memory for storing said digitally sampled voltage and current;
  at least one processor for performing power calculations on said digitally sampled voltage and current, and converting said calculations and said digitally sampled voltage and current into at least one network protocol, said at least one processor being configured to simultaneously execute a plurality of different tasks related to said stored voltage and current in response to a plurality of concurrent requests related to results of said different tasks and submitted by multiple users; and
  a network interface for interfacing with an external network.

8. The electric power meter of claim 7, wherein said network interface supports said multiple users simultaneously.

9. The electric power meter of claim 8, wherein said network interface supports one of 100 base-T and 10 base-T communications.

10. The electric power meter of claim 7, wherein said network protocol is one of Modbus Transmission Control Protocol (TCP), RS-485, e-mail, File Transfer Protocol (FTP), or Dynamic Host Configuration Protocol (DHCP).

11. The electric power meter of claim 7, wherein a web server provides data to the network interface in Hypertext Markup Language (HTML) or Extensible Markup Language (XML) format.

12. The electric power meter of claim 7, further comprising:
  an external device interface for connecting an external device to said electric power meter,
  wherein said external device transmits packet data to said electric power meter to be processed by the processor and provided through said network interface.

* * * * *

(12) EX PARTE REEXAMINATION CERTIFICATE (5878th)
United States Patent
Spanier et al.

(10) Number: US 6,751,563 C1
(45) Certificate Issued: Aug. 28, 2007

(54) ELECTRONIC POWER METER

(75) Inventors: Joseph Spanier, Brooklyn, NY (US); Wei Wang, Bronx, NY (US); Erran Kagan, Port Washington, NY (US)

(73) Assignee: Electro Industries/Gauge Tech, Westbury, NY (US)

Reexamination Request:
No. 90/007,227, Sep. 27, 2004

Reexamination Certificate for:
Patent No.: 6,751,563
Issued: Jun. 15, 2004
Appl. No.: 10/121,262
Filed: Apr. 12, 2002

Related U.S. Application Data

(60) Provisional application No. 60/290,511, filed on May 11, 2001.

(51) Int. Cl.
*G06F 3/06* (2006.01)

(52) U.S. Cl. .................. 702/61; 702/57; 702/60; 702/64

(58) Field of Classification Search ............. None
See application file for complete search history.

(56) References Cited

U.S. PATENT DOCUMENTS

| | | | |
|---|---|---|---|
| 4,225,839 A | 9/1980 | Martincic | |
| 4,377,837 A | 3/1983 | Matsko et al. | |
| 4,900,275 A | 2/1990 | Fasano | |
| 4,957,876 A | 9/1990 | Shibata et al. | |
| 5,001,420 A | 3/1991 | Germer et al. | |
| 5,056,214 A | 10/1991 | Holt | |
| 5,192,227 A | 3/1993 | Bales | |
| 5,248,967 A | 9/1993 | Daneshfar | |
| 5,301,122 A | 4/1994 | Halpern | |
| 5,418,752 A | 5/1995 | Harari et al. | |
| 5,418,837 A | 5/1995 | Johansson et al. | |
| 5,544,312 A | 8/1996 | Hasbun et al. | |
| 5,548,527 A | 8/1996 | Hemminger et al. | |
| 5,555,508 A | 9/1996 | Munday et al. | |
| 5,570,292 A | 10/1996 | Abraham et al. | |
| 5,602,363 A | 2/1997 | Von Arx | |
| 5,627,759 A * | 5/1997 | Bearden et al. | 702/62 |
| 5,650,936 A | 7/1997 | Loucks et al. | |
| 5,654,081 A | 8/1997 | Todd | |
| 5,675,748 A | 10/1997 | Ross | |
| 5,680,640 A | 10/1997 | Ofek et al. | |
| 5,704,805 A | 1/1998 | Douty et al. | |
| 5,710,887 A | 1/1998 | Chelliah et al. | |
| 5,715,314 A | 2/1998 | Payne et al. | |
| 5,736,847 A | 4/1998 | Van Doorn et al. | |
| 5,767,790 A | 6/1998 | Jovellana | |
| 5,811,965 A | 9/1998 | Gu | |
| 5,828,576 A | 10/1998 | Loucks et al. | |
| 5,862,391 A | 1/1999 | Salas | |
| 5,880,927 A | 3/1999 | Kent et al. | |
| 5,896,393 A | 4/1999 | Yard et al. | |
| 5,897,607 A | 4/1999 | Jenney et al. | |
| 5,907,476 A | 5/1999 | Davidsz | |
| 5,909,492 A | 6/1999 | Payne et al. | |
| 5,933,004 A | 8/1999 | Jackson et al. | |
| 5,936,971 A | 8/1999 | Harari et al. | |
| 5,960,204 A | 9/1999 | Yinger et al. | |
| 5,963,734 A | 10/1999 | Ackerman et al. | |
| 5,963,743 A | 10/1999 | Amberg et al. | |
| 5,978,590 A | 11/1999 | Imai et al. | |
| 5,991,543 A | 11/1999 | Amberg et al. | |
| 5,994,892 A | 11/1999 | Turino et al. | |
| 5,995,911 A | 11/1999 | Hart | |
| 6,000,034 A | 12/1999 | Lightbody et al. | |
| 6,008,711 A | 12/1999 | Bolam | |
| 6,009,406 A | 12/1999 | Nick | |
| 6,023,160 A | 2/2000 | Coburn | |
| 6,049,551 A | 4/2000 | Hinderks et al. | |
| 6,059,129 A | 5/2000 | Bechaz et al. | |
| 6,064,192 A | 5/2000 | Redmyer | |
| 6,078,870 A | 6/2000 | Windsheimer | |
| 6,088,659 A | 7/2000 | Kelly et al. | |
| 6,091,237 A | 7/2000 | Chen | |
| 6,092,189 A | 7/2000 | Fisher et al. | |
| 6,144,960 A | 11/2000 | Okada et al. | |
| 6,167,383 A | 12/2000 | Henson | |
| 6,182,170 B1 | 1/2001 | Lee et al. | |
| 6,182,275 B1 | 1/2001 | Beelitz et al. | |
| 6,185,508 B1 | 2/2001 | Van Doorn et al. | |
| 6,192,470 B1 | 2/2001 | Kelley et al. | |
| 6,199,068 B1 | 3/2001 | Carpenter | |
| 6,212,278 B1 | 4/2001 | Bacon et al. | |

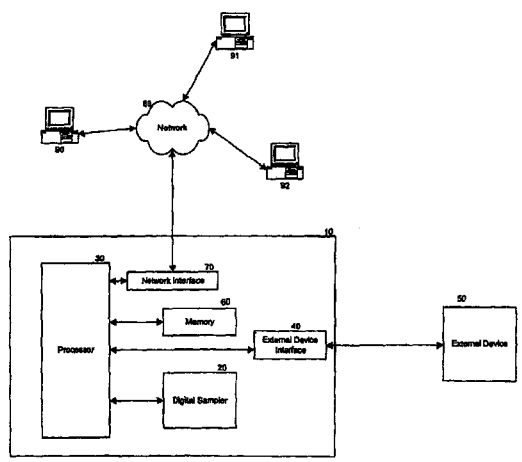

| | | | |
|---|---|---|---|
| 6,219,656 B1 | 4/2001 | Cain et al. | |
| 6,246,994 B1 | 6/2001 | Wolven et al. | |
| 6,247,128 B1 | 6/2001 | Fisher et al. | |
| 6,262,672 B1 | 7/2001 | Brooksby et al. | |
| 6,275,168 B1 | 8/2001 | Slater et al. | |
| 6,301,527 B1 | 10/2001 | Butland et al. | |
| 6,327,706 B1 | 12/2001 | Amberg et al. | |
| 6,363,057 B1 | 3/2002 | Ardalan et al. | |
| 6,367,023 B2 | 4/2002 | Kling et al. | |
| 6,374,084 B1 | 4/2002 | Fok | |
| 6,401,054 B1 | 6/2002 | Andersen | |
| 6,459,175 B1 | 10/2002 | Potega | |
| 6,459,997 B1 | 10/2002 | Andersen | |
| 6,486,652 B1 | 11/2002 | Ouellette et al. | |
| 6,493,644 B1 | 12/2002 | Jonker et al. | |
| 6,496,342 B1 | 12/2002 | Horvath et al. | |
| 6,560,221 B1 * | 5/2003 | Hara et al. | 370/352 |
| 6,694,270 B2 | 2/2004 | Hart | |
| 2001/0001866 A1 | 5/2001 | Kikinis | |
| 2002/0007318 A1 | 1/2002 | Ainwick | |
| 2002/0026385 A1 | 2/2002 | McCloskey et al. | |
| 2002/0065741 A1 | 5/2002 | Baum | |
| 2002/0091784 A1 | 7/2002 | Baker et al. | |
| 2002/0104022 A1 | 8/2002 | Jorgenson | |
| 2002/0152200 A1 | 10/2002 | Krichilsky et al. | |
| 2002/0156694 A1 | 10/2002 | Christensen et al. | |
| 2002/0161536 A1 * | 10/2002 | Suh et al. | 702/62 |
| 2002/0169570 A1 | 11/2002 | Spanier et al. | |
| 2003/0009401 A1 | 1/2003 | Ellis | |
| 2003/0204756 A1 | 10/2003 | Ransom | |

FOREIGN PATENT DOCUMENTS

WO      WO 01/01157 A1    1/2001

OTHER PUBLICATIONS

7700 Ion 3–Phase Power Meter, Analyzer and Controller, pp. 1–8, Nov. 30, 2000.

6200 ION, Installation & Basic Setup Instructions, ©Power Measurement Ltd., Revision Date Apr. 25, 2001, 50 pages.

ION® Technology, Meter Shop User's Guide, ©Power Measurement Ltd., Revision Date May 10, 2001, 48 pages.

New MeterM@il™ and WebMeter™ features connect power meters over the Internet, announcement by Power Measurement, Ltd., www.pwrm.com/company/news/a51, Dec. 6, 2000. p. 1, printed Jan. 30, 2004.

User's Installation & Operation and User's Programming Manual, The Futura Series, Electro Industries, pp. 1–64, ©1995.

Nexus 1250 Installation and Operation Manual Revision 1.20, Electro Industries/Gauge Tech, 50 pages, Nov. 8, 2000.

ION 7700™ Xpress Card, Installation & Basic Setup Guide, Power Measurement, pp. 1–15, revision date Sep. 26, 1997.

Nexus 1250, Precision Power Meter & Data Acquisition Node, Accumeasure® Technology, Electro Industries/GaugeTech, specification, 16 pages, Nov. 1999.

Multi–port Communications Card (MPCC), Multip–Port Ethernet Communications Card (MPE), Installation & Configuration Instructions, Power Measurement, pp. 1–9, revision date Jul. 25, 1997.

What's New in the 7500 ION, Addendum to the User's Guid Addendum v206, Power Measurement, pp. 1–33, Dec. 20, 2000.

ION Technology, 7500 ION High Visibility 3–Phase Energy & Power Quality Meter, Power Measurement, specification, pp. 1–8, revision date Mar. 21, 2000.

ION® Technology 7500 ION 7600 ION High Visibility Energy and Power Quality Compliance Meters, specification, Power Measurement, pp. 1–8, revision date Nov. 30, 2000.

Engage Networks, Inc., *"Internet Protocol Card for Revenue Meters,"* http://www.engagenet.com. Link present as of Mar. 3, 2000 on http://web.archive.org/web/20010306005433/www.engagenet.com/content/products.shtml. Original document archived at http://web.archive.org/web/20030520161648/http://www.engagenet.com/datasheets/ip-card.pdf on May 20, 2003.

Performance Power Meter & Data Acquisition Node, Electro Industries/Gauge Tech, Nexus 1250 specification, 8 pages, Dec. 14, 2000.

Futura+ Series, "Advanced Power Monitoring and Analysis for the $21^{st}$ Century", Electro Industries/Gauge Tech, specification, 8 pages, Apr. 13, 2000.

* cited by examiner

*Primary Examiner*—Minh Nguyen

(57) ABSTRACT

An electric power meter having a digital sampler for sampling a voltage and a current at a sampling point and having a processor for processing at least one of the sampled voltage and the sampled current. A memory is provided for storing network protocol conversion algorithms. The electric utility power meter has a network interface. The processor performs at least one power calculation and converts at least one of the sampled voltage, the sampled current and the power calculation to at least one network protocol using said network protocol conversion algorithms, said at least one network protocol provided through said network interface.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 6 and 12 are cancelled.

Claims 1 and 7 are determined to be patentable as amended.

Claims 2–5 and 8–11, dependent on an amended claim, are determined to be patentable.

1. An electric power meter having a digital sampler for sampling a voltage and a current at a sampling point comprising:
   a processor coupled to said digital sampler and configured to execute a plurality of different tasks related to said sampled voltage and current and running independently from one another in response to a plurality of concurrent requests submitted by multiple users;
   a memory coupled to said processor for storing network protocol conversion algorithms; [and]
   a network interface configured to simultaneously provide said multiple users each with a result of a respective one of said plurality of different tasks; *and*
   *an external device interface for connecting at least one external device to said electric power meter;*
   wherein said processor performs at least one power calculation and converts at least one of the sampled voltage, the sampled current and the power calculation to at least one network protocol using one of said network protocol conversion algorithms, said at least one network protocol being provided through said network interface *and wherein said at least one external device transmits packet data related to said power quality data to said multiple users through said network interface, said processor being operative to email alarms and response to meeting predefined conditions.*

7. An electric power meter, comprising:
   a digital sampler for digitally sampling voltage and current;
   a memory for storing said digitally sampled voltage and current;
   at least one processor for performing power calculations on said digitally sampled voltage and current, and converting said calculations and said digitally sampled voltage and current into at least one network protocol, said at least one processor being configured to simultaneously execute a plurality of different tasks related to said stored voltage and current in response to a plurality of concurrent requests related to results of said different tasks and submitted by multiple users; [and]
   a network interface for interfacing with an external network; *and*
   *an external device interface for connecting an external device to said electric power meter,*
   *wherein said external device transmits packet data to said electric power meter to be processed by the processor and provided through said network interface.*

\* \* \* \* \*